(12) United States Patent
Mustafa et al.

(10) Patent No.: US 11,588,068 B2
(45) Date of Patent: Feb. 21, 2023

(54) INFRARED PHOTODETECTOR ARCHITECTURES FOR HIGH TEMPERATURE OPERATIONS

(71) Applicant: Raytheon Company, Waltham, MA (US)

(72) Inventors: Jamal Mustafa, Goleta, CA (US); Edward P. Smith, Goleta, CA (US); Bradly Eachus, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 139 days.

(21) Appl. No.: 17/100,041

(22) Filed: Nov. 20, 2020

(65) Prior Publication Data

US 2022/0165903 A1   May 26, 2022

(51) Int. Cl.

| | |
|---|---|
| *H01L 31/11* | (2006.01) |
| *H01L 27/146* | (2006.01) |
| *H01L 31/0304* | (2006.01) |
| *H01L 31/18* | (2006.01) |

(52) U.S. Cl.
CPC .... *H01L 31/1105* (2013.01); *H01L 27/14681* (2013.01); *H01L 27/14689* (2013.01); *H01L 31/03046* (2013.01); *H01L 31/18* (2013.01)

(58) Field of Classification Search
CPC ........... H01L 31/1105; H01L 31/03046; H01L 31/18; H01L 31/02327; H01L 31/035281; H01L 27/14681; H01L 27/14689
See application file for complete search history.

(56) References Cited

U.S. PATENT DOCUMENTS

| | | | |
|---|---|---|---|
| 9,356,178 B2 | 5/2016 | Peale et al. | |
| 9,472,697 B2 | 10/2016 | Wehner et al. | |
| 9,536,917 B2 | 1/2017 | Wehner et al. | |
| 9,929,291 B2 | 3/2018 | Smith et al. | |
| 11,264,526 B1 * | 3/2022 | Nguyen | H01L 31/035236 |
| 2010/0308211 A1 * | 12/2010 | Cho | H05B 45/305 |
| | | | 250/214 R |

(Continued)

FOREIGN PATENT DOCUMENTS

| | | | |
|---|---|---|---|
| CN | 111048605 A | * | 4/2020 |
| JP | 2002100752 A | | 4/2002 |

OTHER PUBLICATIONS

Peters et. al., "Application of plasmonic subwavelength structuring to enhance infrared detection", Proceedings vol. 8994, Photonic and Phononic Properties of Engineered Nanostructures IV; 899419 (2014), Event: SPIE OPTO, 2014, San Francisco, California, United States (Year: 2014).*

(Continued)

*Primary Examiner* — Sitaramarao S Yechuri
(74) *Attorney, Agent, or Firm* — Burns & Levinson, LLP; Joseph M. Maraia (57) ABSTRACT

A photo detector having a substrate and a first structure formed on the substrate. The first structure includes an emitter layer formed on the substrate and a base layer formed on the emitter layer. Further, the first structure includes a collector layer formed on the base layer. The collector layer has a plasmonic structure. The plasmonic structure includes a first plurality of mesa structures. Each of the mesa structures of the first plurality of mesa structures includes a second plurality of mesa structures having ridges arranged in a regularly repeating pattern.

20 Claims, 5 Drawing Sheets

(56) References Cited

U.S. PATENT DOCUMENTS

2015/0221796 A1  8/2015  Smith et al.
2018/0374981 A1* 12/2018  Carr .................. H05B 3/20

OTHER PUBLICATIONS

Dorodnyy et al. Plasmonic Photodetectors. IEEE Journal of Selected Topics in Quantum Electronics, vol. 24, No. 6 (2018).
Haddadi et al. Mid-wavelength infrared heterojunction phototransistors based on type-II InAs/AlSb/GaSb superlattices Appl. Phys. Lett. 109, 021107 (2016).
Haddadi, et al., "Type-II InAs/GaSb/AlSb superlattice-based heterojunction phototransistors: back to the future," Proceedings of SPIE; [Proceedings of SPIE ISSN 0277-786X vol. 10540], SPIE, US, vol. 10540, 1054004, Jan. 26, 2018 (Jan. 26, 2018), pp. 1-12, XP060106412, DOI: 10.1117/12.2297475, ISBN: 978-1-5106-1533-5.
Law, et al., "Epitaxial growth of engineered metals for mid-infrared plasmonics," Journal of Vacuum Science, American Institute of Physics, 2 Huntington Quadrangle, Melville, NY 11747, vol. 31, No. 3, May 1, 2013 (May 1, 2013), pp. 3C121-3C121, XP012172581, ISSN: 2166-2746, DOI: 10.1116/1.4797487.
Milla, et al., "Localized surface plasmon reasonance frequency tuning in highly doped InAsSb/GaSb one-dimensional nanostructures," Nanotechnology, Institute of Physics Publishing, Bristol, GB, vol. 27, No. 42, Sep. 8, 2016 (Sep. 8, 2016), p. 425201, XP020309625, ISSN: 0957-4484, DOI: 10-1088/0957-4484/27/42/425201 [retrieved on Sep. 8, 2016].
Peters, et al., "Appication of plasmonic subwavelength structuring to enhance infrared detection," Proceedings of SPIE, IEEE, US, vol. 8994, Feb. 19, 2014 (Feb. 19, 2014), pp. 899419-899419, XP060036139, DOI: 10.1117/12.2040727, ISBN: 978-1-62841-730-2.

\* cited by examiner

INFRARED PHOTODETECTOR ARCHITECTURES FOR HIGH TEMPERATURE OPERATIONS

TECHNICAL FIELD

The application relates to infrared photodetectors and, more particularly, an infrared photodetector with plasmonic structure.

BACKGROUND

An infrared photodetector is an electronic device that converts infrared electromagnetic waves into an electronic signal. Infrared photodetectors are used widely in both military and civilian applications related to, for example, biomedicine, surveillance, communications, and astronomy.

Infrared photodetectors are increasingly being used in high temperature environments. Unfortunately, conventional infrared photodetectors have demonstrated relatively poor performance at higher temperatures due to thermally induced noise. As conventional infrared detectors are sensitive to thermal noise, they are typically cooled and operated at very low cryogenic temperatures to achieve low leakage currents (i.e., noise).

The effectiveness of existing detectors remains limited, especially at higher temperatures, by thermally generated diffusion currents. The noise in these detectors is often affected by the thickness of the absorber region. Furthermore, other operational characteristics, such as quantum efficiency, can be degraded depending on absorber thickness. Therefore, there is a need for infrared detector architectures capable of realizing more robust and efficient operations over a wider temperature range with lower noise and higher quantum efficiency.

SUMMARY

The application, in various implementations, addresses deficiencies associated with the performance and architectural structure of infrared photodetectors.

This application describes exemplary infrared phototransistor with a plasmonic structure that is able to realize internal gain and leverage the benefits of light concentration. To achieve this particular advantage, the collector regions are engineered to have a particular shape and pattern to form a plasmonic structure that enhances absorption. One of the advantages of the mesa plasmonic structures is the ability to concentrate the incident light onto a small detector element to reduce thermally-generated dark leakage current and/or noise at the collector, resulting in a good signal-to-noise ratio (SNR) performance. In particular, the disclosed infrared photodetector includes a plasmonic structure that has a mesa structure form including the ridges arranged in a regularly repeating pattern. This specific mesa structure enables the photodetector to operate at higher temperatures with an excellent SNR that has not been previously achievable.

The inventors realized the synergistic effect and technical advantage of implementing an infrared detector having plasmonic structures while including a relatively thin collector. Such an architecture substantially reduces leakage current and/or noise at the collector, especially at higher temperatures, by reducing collector thickness, while also compensating for any absorption loss caused by the reduced collector thickness by implementing a plasmonic structure using macro and/or micro mesa structures.

In one aspect of the disclosure, a photodetector includes a substrate; and a first structure formed on the substrate. The first structure includes an emitter layer formed on the substrate, a base layer formed on the emitter layer, and a collector layer formed on the base layer. The collector layer has a plasmonic structure. The plasmonic structure includes a first plurality of mesa structures. Each of the mesa structures of the first plurality of mesa structures includes a second plurality of mesa structures having ridges arranged in a regularly repeating pattern.

In some implementations, the second plurality of mesa structures may concentrate an incident light in the collector layer. In one implementation, the collector layer is configured to decrease thermally generated dark current in the photo detector.

In some implementations, the emitter layer decreases hole injection from the base layer into the emitter layer.

In some implementations, the plasmonic structure may increase infrared absorption in the photo detector. In some implementations, the first plurality of mesa structures are arranged in a grating pattern.

In some implementations, the second plurality of mesa structures comprises at least one of a rectangle shape, a square shape, a hexagon shape, a rhombus shape, a trapezium shape, a circle shape, a triangle shape, and a pentagon shape.

In one implementation, the substrate may include GaSb. In some implementations, the emitter layer may include at least one of III-V strained-layer superlattice materials, comprised of III-V binary, ternary, and quaternary alloys, such as InAs, InAsSb, AlSb, AlGaSb, GaInSb, or GaInAsSb. In some implementations, the base layer may include at least one of III-V strained-layer superlattice materials, comprised of III-V binary, ternary, and quaternary alloys, such as InAs, InAsSb, AlSb, AlGaSb, GaInSb, or GaInAsSb. In some implementations, the plasmonic structure may include at least one of III-V strained-layer superlattice materials, comprised of III-V binary, ternary, and quaternary alloys, such as InAs, InAsSb, AlSb, AlGaSb, GaInSb, or GaInAsSb.

In one implementation, the first plurality of mesa structures may have ridges arranged in a regularly repeating pattern.

In some implementations, the repeating pattern of the ridges of the second plurality of mesa structures is configured to enhance detection of light in a target frequency band.

In a further aspect, a method of fabricating a photo detector includes providing a substrate and fabricating a first structure formed on the substrate. The first structure includes an emitter layer formed on the substrate, a base layer formed on the emitter layer, and a collector layer formed on the base layer. The collector layer has a plasmonic structure. The plasmonic structure includes a first plurality of mesa structures. Each of the mesa structures of the first plurality of mesa structures includes a second plurality of mesa structures having ridges arranged in a regularly repeating pattern.

In a further aspect, a photodetector includes a substrate and a first structure formed on the substrate. The first structure includes an emitter layer formed on the substrate, a base layer formed on the emitter layer, and a collector layer formed on the base layer. The collector layer has a plasmonic structure. The plasmonic structure includes a plurality of macro mesa structures. Each of the macro mesa structures includes a plurality of micro mesa structures having ridges arranged in a regularly repeating pattern. A first macro mesa structure of the plurality of macro mesa structures includes a first micro mesa structure having ridges arranged in a first pattern to enhance detection of light within a first frequency band.

In some implementations, the photodetector may include a second macro mesa structure. The second macro mesa structure includes a second micro mesa structure having ridges arranged in a second pattern to enhance detection of light within a second frequency band.

BRIEF DESCRIPTION OF THE DRAWINGS

Various aspects of the present disclosure are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The figures are provided for the purposes of illustration and explanation and are not intended as a definition of the limits of the invention.

DETAILED DESCRIPTION

The application, in various aspects, addresses deficiencies associated the existing polarization techniques for image sensors. In the following detailed description, numerous specific details are set forth in order to provide a thorough understanding of the aspects of the present disclosure. It will be understood by those of ordinary skill in the art that these aspects may be practiced without some of these specific details. In other instances, well-known methods, procedures, components and structures may not have been described in detail so as not to obscure the described aspects.

The present disclosure provides an infrared phototransistor with a plasmonic structure that is able to realize the internal gain and leverage the benefits of light concentration. Particularly, the collector regions are engineered to have a particular shape and pattern to form a plasmonic structure that enhances absorption.

Current detection technologies are mainly based on absorption of the absorber layer. The absorption of the absorber layer depends both on the absorption coefficient and thickness of the absorber layer. For efficient photon detection, the detector structure requires both high absorption coefficient and large thickness of the absorber layer. However, the absorption coefficient is fixed, therefore, very large thickness is required to ensure efficient photon detection.

For an ideal photodetector, there exists a trade-off between quantum efficiency and thickness of absorption layer. Higher quantum efficiency is achieved in a thicker absorption layer, but at the expense of larger diffusion currents associated with the absorber volume.

Previous attempts to engineer infrared photodetectors with low leakage current and high quantum efficiency typically fall into two categories. First, by adding internal gain and second, by concentrating the incident light (signal). Heterojunction phototransistor (HPT) detectors can have thin absorbers with poor intrinsic absorption. Therefore, their gain mechanism enhances the signal and can achieve high quantum efficiencies. Plasmonic structures can concentrate the incident light onto a small detector element (low noise) to achieve good signal to noise ratio (SNR) performance. The low noise achieved with plasmonic structures is a result of the drastic reduction of the absorber volume required for efficient absorption of the incoming radiation.

The inventors realized that a combination of an HPT using a collector and/or absorber with a plasmonic structure has a synergistic effect of reducing unwanted leakage current and/or noise while enhancing detector gain by focusing light incident on the absorber. Plasmonic materials have unique properties of enhancing light arising from the interaction between light with metallic nanostructures at sub-wavelength scale. Those nanostructures have the capability of supporting collective electron excitations (plasmons). As plasmon resonance occurs, the ability to concentrate light in extremely small volume enables the significant absorption of electromagnetic waves, therefore, facilitating the interaction between light and optoelectrical absorbers. In the infrared range, metallic nanostructures may be integrated with semiconductor detectors to enhance the absorption of photons, therefore, to improve the photoelectrical conversion efficiency.

The present disclosure describes, in some implementations, a hybrid HPT/plasmonic structure that is able to realize the internal gain and leverage the benefits of light concentration. A conventional HPT has emitter, base, and collector regions, with the thin base and collector forming the absorber. The present disclosure includes a mesa-delineated pixel structure with a segmented base and collector formed on a common emitter region. The collector regions may be engineered to have a particular shape and/or pattern to form a plasmonic structure that enhances absorption. In some implementations, the shape and/or pattern is configured to tune a photodetector to maximize detector gain at a particular frequency band. For example, a photodetector may be configured and/or tuned to detector light, without limitation, in the mid-wave infrared (MWIR) band.

One of the novel features of the present disclosure is the combination of phototransistor architectures with plasmonic structures for efficient broadband absorption. That is, a phototransistor with a segmented collector region is one of the novel aspect that admits development of the integrated plasmonic elements.

Figure 1A:
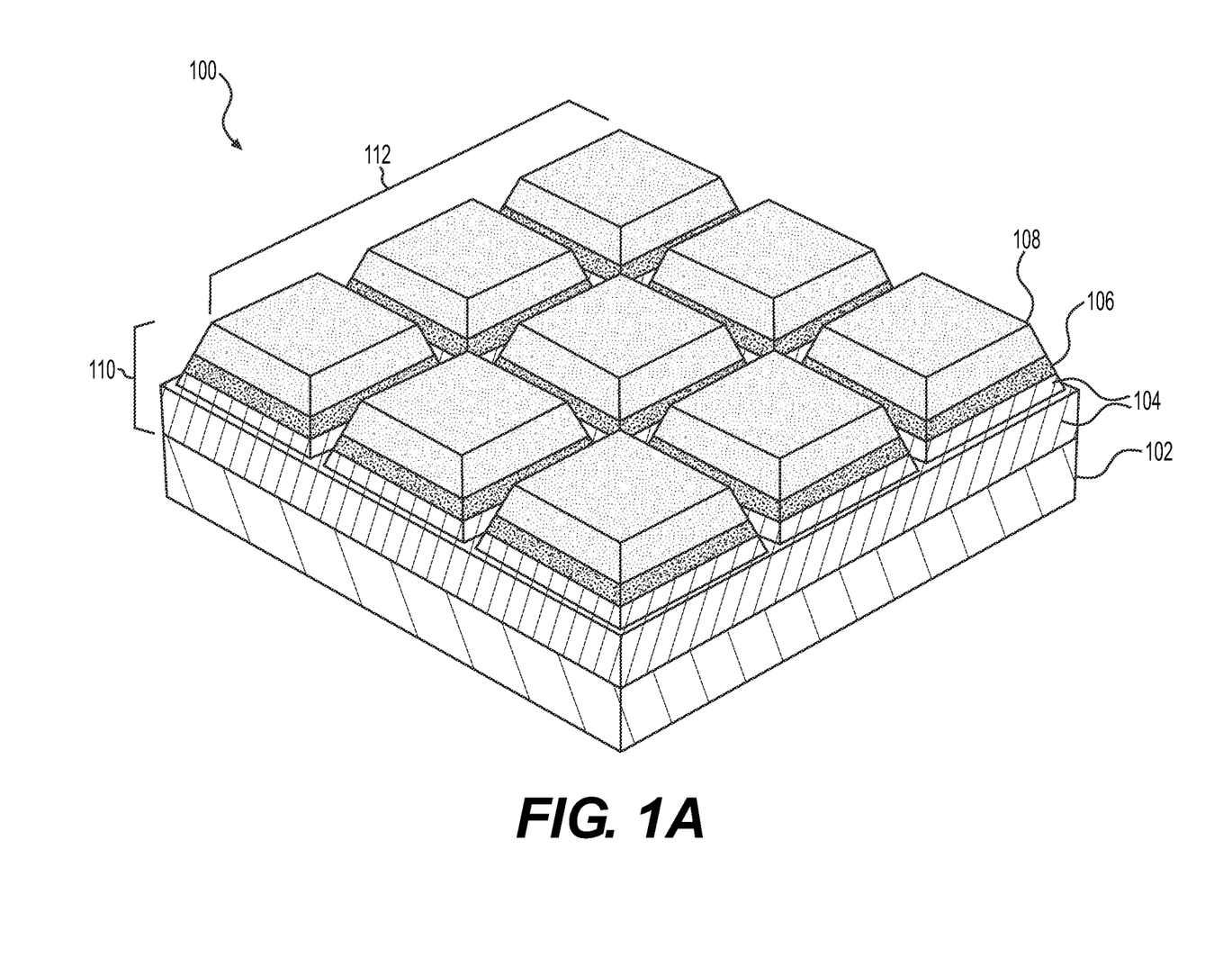
FIG. 1A is a perspective view of one example of a portion of an array of an infrared photodetector.
Figure 1B:
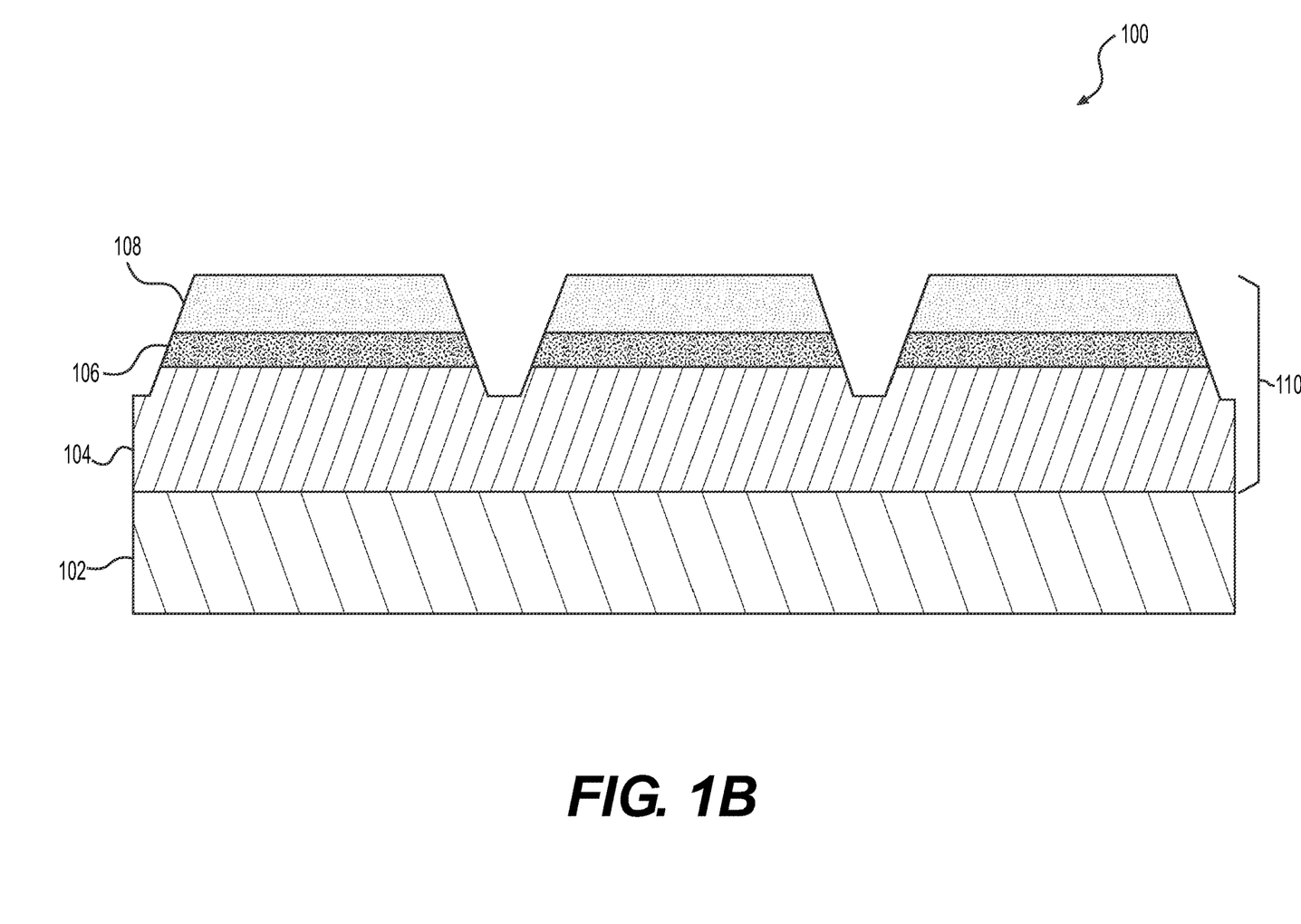
FIG. 1B is a cross sectional view of an array of the infrared photodetector of FIG. 1A.

FIG. 1A is a perspective view of one example of a portion of an array of an infrared photodetector 100. FIG. 1B is a cross sectional view of an array of the infrared photodetector 100 of FIG. 1A. The photodetector 100 includes substrate 102 and first structure 110 fabricated on substrate 102. Substrate 102 can include various materials, such as GaAs and GaSb. First structure 110 may include emitter layer 104 formed on the substrate 102 and base layer 106 formed on emitter layer 104. Emitter layer 104 and base layer 106 can be fabricated through various semiconductor fabrication techniques and etched to achieve a desired structure. Emitter layer 104 is configured to decrease hole injection from base layer 106 into emitter layer 104. Emitter layer 104 and base layer 106 each can be made of various materials, e.g., III-V strained-layer superlattice materials, comprised of III-V binary, ternary, and quaternary alloys, such as InAs, InAsSb, AlSb, AlGaSb, GaInSb, or GaInAsSb. Collector layer 108 is formed on the base layer 106 through semiconductor fabrication techniques. Collector layer 108 may include a plasmonic structure. A plasmonic structure may be capable of increasing infrared absorption in the photodetector 100. As shown, a plasmonic structure may include a first plurality of mesa structures 112. In some implementations, the first set of mesa structures 112 have ridges arranged in a regularly repeating pattern.

The first set of mesa structures 112 can have various shapes. Depending on the shape of the mesa structures, the resonance of plasmonic structure varies and can be tuned to result in better absorption in the photodetector 100. In an exemplary photodetector, the first set of mesa structures 112 can have a rectangle shape, a square shape, a hexagon shape, a rhombus shape, a trapezium shape, a circle shape, a triangle shape, and a pentagon shape. In some implementations, a photodetector has a mesa-delineated structure including a wide-bandgap emitter to reduce hole injection from the base into the emitter. This may enable a large valence band offset by the emitter. The photodetector may include a thin collector and/or absorber that reduces thermally-generated dark current for higher operating temperatures.

Figure 2A:
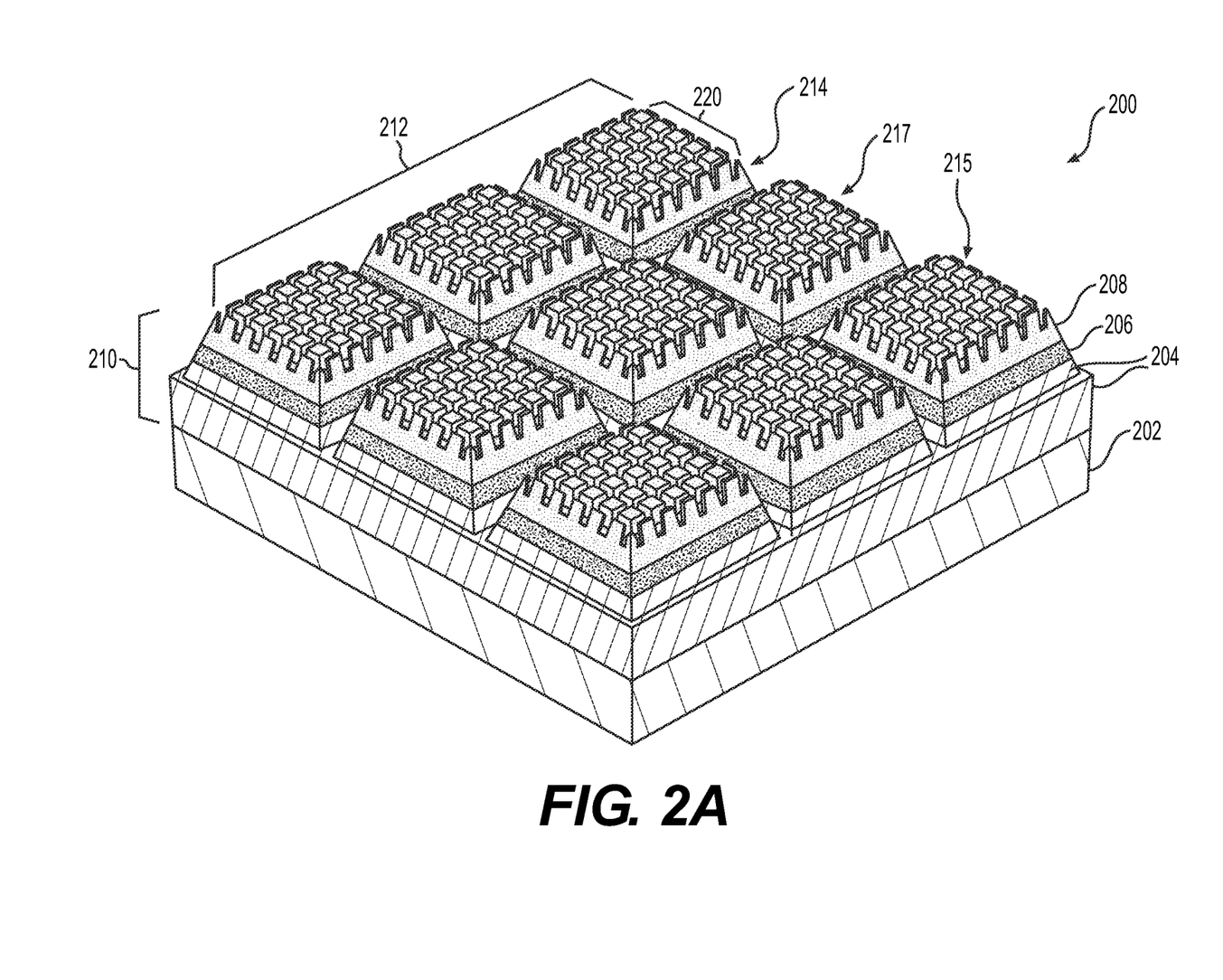
FIG. 2A is a perspective view of one example of a portion of an array of an infrared photodetector.
Figure 2B:
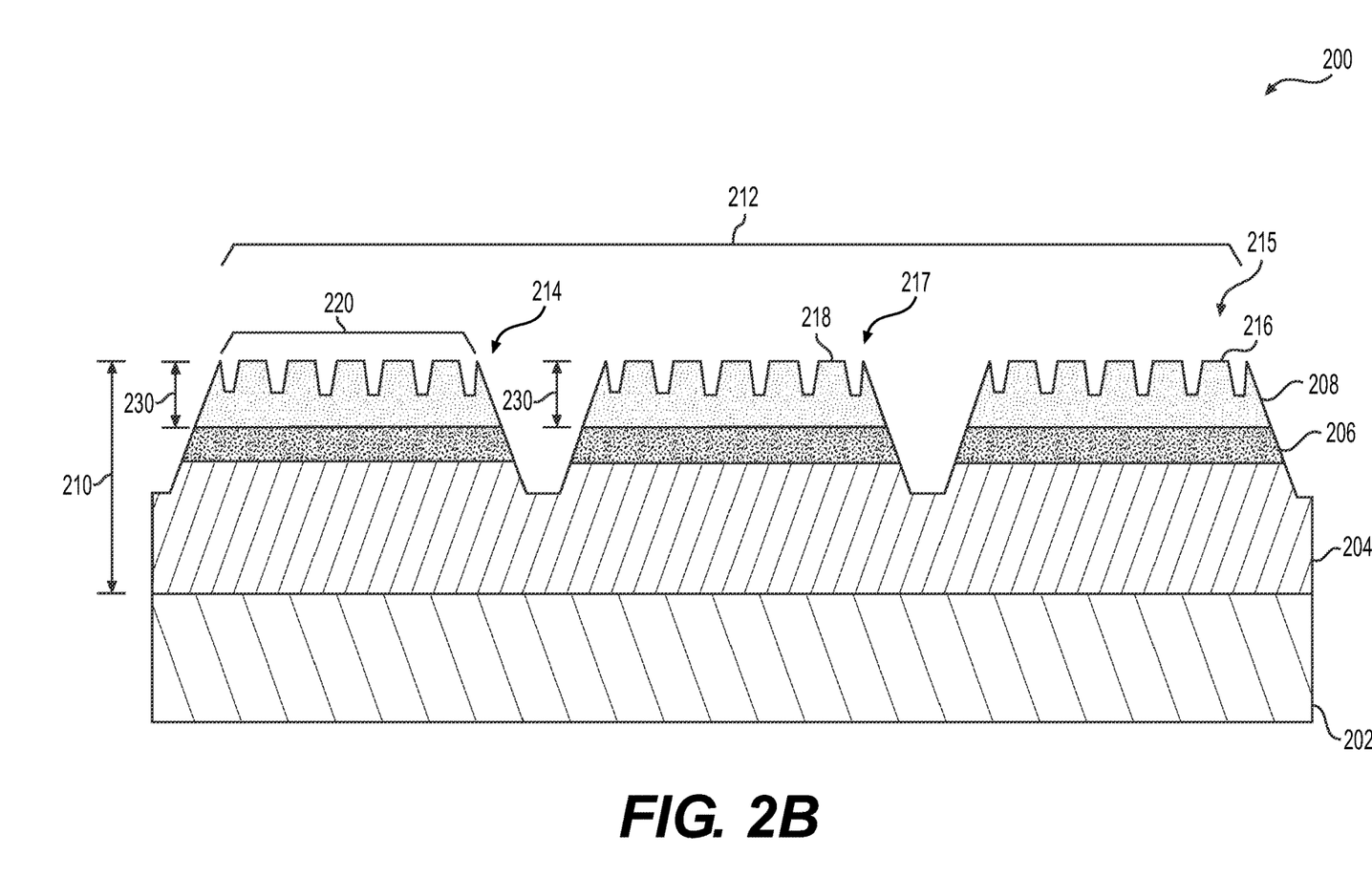
FIG. 2B is a cross sectional view of an array of the infrared photodetector of FIG. 2A.

FIG. 2A and FIG. 2B are perspective view and cross sectional view, respectively, of an exemplary infrared photodetector 200. Similar to photodetector 100 of FIG. 1A-1B, photodetector 200 includes substrate 202 and first structure 210 fabricated on substrate 202. First structure 210 may include emitter layer 204 formed on the substrate 202 and base layer 206 formed on emitter layer 204. Similar to photodetector 100 of FIGS. 1A-1B, emitter layer 204 and base layer 206 can be fabricated through various semiconductor fabrication techniques and etched to achieve a desired structure. Emitter layer 204 is configured to decrease hole injections from base layer 106 into emitter layer 104. After emitter layer 204 is formed, collector layer 208 is fabricated. Collector layer 208 is formed on the base layer 206 through semiconductor fabrication techniques. Collector layer 208 may include a plasmonic structure. For example, the set of macro mesa structures and/or micro mesa structures formed on the top surface of a macro mesa may be arranged and/or segmented to form a plasmonic structure 230. As stated above, the plasmonic structure is configured to increase infrared absorption in photodetector 200. As shown in FIGS. 2A-2B, the plasmonic structure may include a first set of mesa structures 212. In some implementations, the first set of mesa structures 212 has ridges arranged in a regularly repeating pattern. In order to better concentrate an incident light in collector layer 208, each of the mesa structures 214, 215, 217 of the first set of mesa structures 212 may include a second set of mesa structures 220. In some implementations, a second set of mesa structures 220 has ridges arranged in a regularly repeating pattern. As stated above, one of the novel features of photodetector 200 is that it is able to operate at higher temperatures with very low noise which has not been achievable in the past. This capability is due to the plasmonic structures which are capable of strongly absorbing light of a particular wavelength, resulting in thinner collectors. The reduction in collector volume 208 leads to lower diffusion currents (leakage current) in photodetector 200. The repeating pattern of the ridges of the second set of mesa structures 220 may also be configured to enhance detection of light in a target frequency band.

As stated above, the first set of mesa structures 212 can have various shapes. Depending on the shape of the mesa structures, the resonance of the plasmonic structure varies and can be tuned to result in an improved sensitivity of photodetector 200, i.e., lower noise. In an exemplary photodetector, the first set of mesa structures 212 and the second set of mesa structure 220, each can have a rectangle shape, a square shape, a hexagon shape, a rhombus shape, a trapezium shape, a circle shape, a triangle shape, and/or a pentagon shape.

In some implementations, a plasmonic structure includes a plurality of macro mesa structures 212. As shown in FIG. 2B, each of the macro mesa structures 214, 215, 217 includes a plurality of micro mesa structures 220. The plurality of micro mesa structures 220 may have ridges arranged in a regularly repeating pattern. A first macro mesa structure 215 of the plurality of macro mesa structures 212 may include a first micro mesa structure 216 having ridges arranged in a first pattern to enhance detection of light within a first frequency band. Further, photodetector 200 may include a second macro mesa structure 217 of the plurality of macro mesa structures 212 including a second micro mesa structure 218 having ridges arranged in a second pattern to enhance detection of light within a second frequency band.

Figure 3:
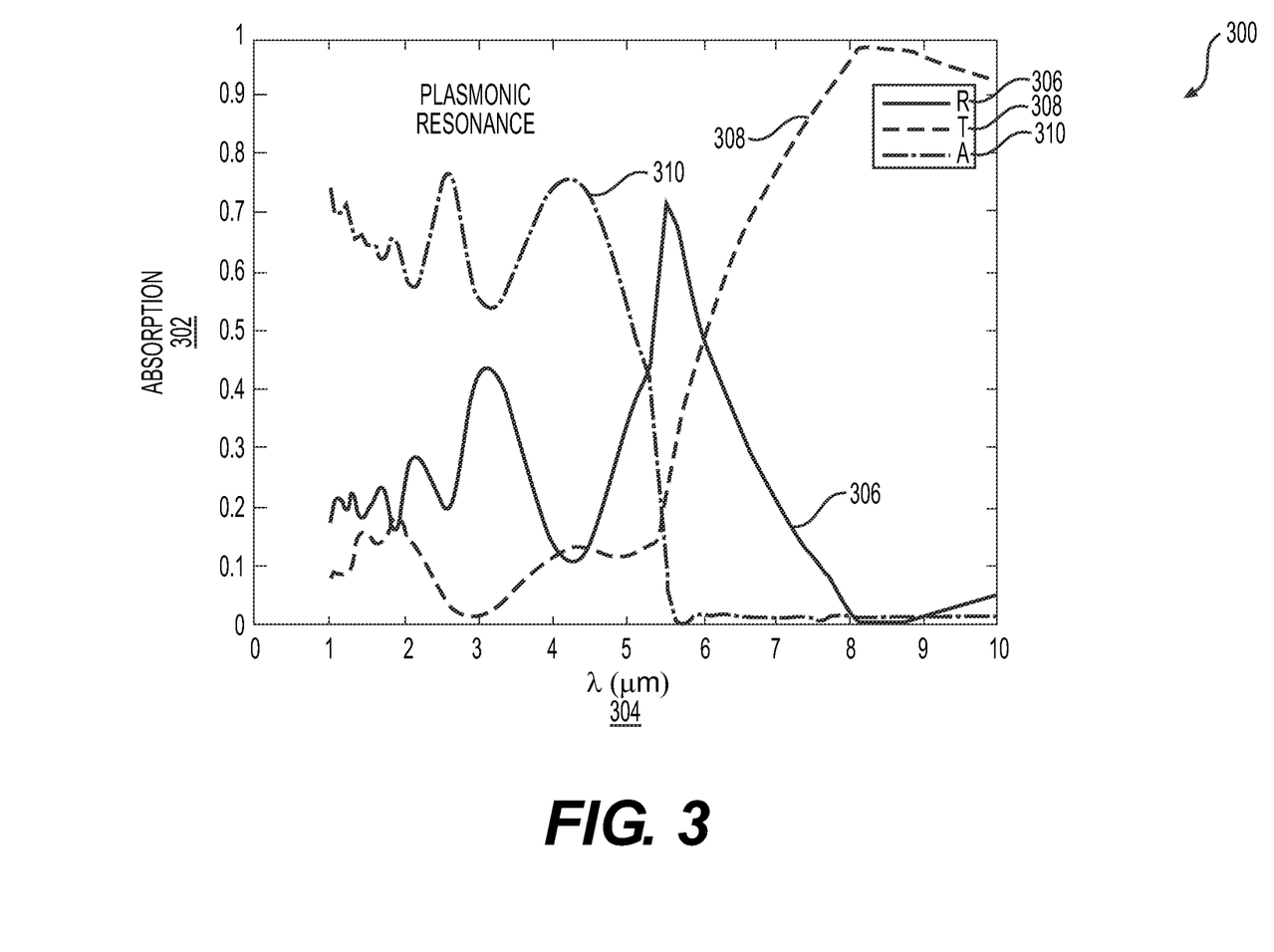
FIG. 3 is a graph illustrating plasmonic resonance change for InAsSb alloy on GaAs substrate.

FIG. 3 is a graph 300 illustrating plasmonic resonance change for InAsSb alloy on GaAs substrate. Graph 300 illustrates a plot of the reflectance 306, transmittance 308, and absorbance 310 vs. wavelength 304. As FIG. 3 illustrates plasmonic resonance can be tuned by changing the mesa structures shape. Mesa structures, both macro or micro mesa structure, can have various shapes; e.g., rectangle shape, a square shape, a hexagon shape, a rhombus shape, a trapezium shape, a circle shape, a triangle shape, and a pentagon shape. Depending on the material and the shape of the mesa structure, the plasmonic resonance can be tuned for the best absorption.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

Although the present disclosure has been described herein with reference to particular embodiments, the present disclosure is not intended to be limited to the particulars disclosed herein; rather, the present disclosure extends to all functionally equivalent structures, methods and uses, such as are within the scope of the claims.

What is claimed is:

1. A photodetector comprising:
   a substrate; and
   a first structure formed on the substrate; the first structure including:
      an emitter layer formed on the substrate;

a base layer formed on the emitter layer; and a collector layer formed on the base layer having a plasmonic structure, the plasmonic structure including a first plurality of mesa structures, wherein each of the mesa structures of the first plurality of mesa structures includes a second plurality of mesa structures having ridges arranged in a regularly repeating pattern.

2. The photodetector of claim 1, wherein the second plurality of mesa structures concentrate an incident light in the collector layer.

3. The photodetector of claim 1, wherein the collector layer is configured to decrease thermally generated dark current in the photo detector.

4. The photodetector of claim 1, wherein the emitter layer decreases hole injection from the base layer into the emitter layer.

5. The photodetector of claim 1, wherein the plasmonic structure increases infrared absorption in the photo detector.

6. The photodetector of claim 1, wherein the first plurality of mesa structures are arranged in a grating pattern.

7. The photodetector of claim 6, wherein the first plurality of mesa structures having ridges arranged in a regularly repeating pattern.

8. The photodetector of claim 1, wherein the second plurality of mesa structures comprises at least one of a rectangle shape, a square shape, a hexagon shape, a rhombus shape, a trapezium shape, a circle shape, a triangle shape, and a pentagon shape.

9. The photodetector of claim 1, wherein the substrate comprises of GaSb.

10. The photodetector of claim 1, wherein the emitter layer comprises at least one of III-V strained-layer superlattice materials, comprised of III-V binary, ternary, and quaternary alloys, such as InAs, InAsSb, AlSb, AlGaSb, GaInSb, or GaInAsSb.

11. The photodetector of claim 1, wherein the base layer comprises at least one of III-V strained-layer superlattice materials, comprised of III-V binary, ternary, and quaternary alloys, such as InAs, InAsSb, AlSb, AlGaSb, GaInSb, or GaInAsSb.

12. The photodetector of claim 1, wherein the plasmonic structure is comprises at least one of III-V strained-layer superlattice materials, comprised of III-V binary, ternary, and quaternary alloys, such as InAs, InAsSb, AlSb, AlGaSb, GaInSb, or GaInAsSb.

13. The photodetector of claim 1, wherein the repeating pattern of the ridges of the second plurality of mesa structures is configured to enhance detection of light in a target frequency band.

14. A method of fabricating a photodetector comprising:
providing a substrate;
fabricating a first structure formed on the substrate; the first structure including:
fabricating an emitter layer formed on the substrate;
fabricating a base layer formed on the emitter layer; and
fabricating a collector layer formed on the base layer having a plasmonic structure, the plasmonic structure including a first plurality of mesa structures, wherein each of the mesa structures of the first plurality of mesa structures includes a second plurality of mesa structures having ridges arranged in a regularly repeating pattern.

15. The method of claim 14, wherein the second plurality of mesa structures concentrate an incident light in the collector layer.

16. The method of claim 14, wherein the collector layer is configured to decrease thermally generated dark current in the photo detector.

17. The method of claim 14, wherein the emitter layer decreases hole injection from the base layer into the emitter layer.

18. A photodetector comprising:
a substrate; and
a first structure formed on the substrate; the first structure including:
an emitter layer formed on the substrate;
a base layer formed on the emitter layer; and
a collector layer formed on the base layer having a plasmonic structure, the plasmonic structure including a plurality of macro mesa structures, wherein each of the macro mesa structures includes a plurality of micro mesa structures having ridges arranged in a regularly repeating pattern, wherein a first macro mesa structure of the plurality of macro mesa structures includes a first micro mesa structure having ridges arranged in a first pattern to enhance detection of light within a first frequency band.

19. The photodetector of claim 18, comprising a second macro mesa structure of the plurality of macro mesa structures including a second micro mesa structure having ridges arranged in a second pattern to enhance detection of light within a second frequency band.

20. The photodetector of claim 18, wherein the plurality of micro mesa structures comprises at least one of a rectangle shape, a square shape, a hexagon shape, a rhombus shape, a trapezium shape, a circle shape, a triangle shape, and a pentagon shape.

* * * * *